United States Patent [19]

Lowe et al.

[11] 4,099,204
[45] Jul. 4, 1978

[54] DELAY CIRCUIT

[75] Inventors: Virgil L. Lowe; Philip V. C. Craig, both of Gainesville, Fla.

[73] Assignee: Edutron Incorporated, Gainesville, Fla.

[21] Appl. No.: 568,029

[22] Filed: Apr. 14, 1975

[51] Int. Cl.² ............................................. H04N 5/04
[52] U.S. Cl. ........................................ 358/149; 358/8
[58] Field of Search ............... 178/69.5 TV, 69.5 DC; 328/55; 358/39, 149, 8

[56] References Cited

U.S. PATENT DOCUMENTS

| | | | |
|---|---|---|---|
| 3,454,719 | 7/1969 | Horstmann et al. | 358/149 |
| 3,622,809 | 11/1971 | Williams | 328/55 X |
| 3,631,269 | 12/1971 | Monahan | 328/55 X |
| 3,644,749 | 2/1972 | Wilcox | 358/39 X |
| 3,681,522 | 8/1972 | Tanabe | 178/69.5 DC X |
| 3,758,711 | 9/1973 | Crosno | 178/69.5 DC X |
| 3,763,317 | 10/1973 | Coleman, Jr. et al. | 358/8 X |

*Primary Examiner*—Richard Murray
*Attorney, Agent, or Firm*—Beveridge, De Grandi, Kline & Lunsford

[57] ABSTRACT

A voltage controlled, active variable delay circuit for pulse signals, and a video signal time base corrector incorporating that variable delay circuit. The variable delay circuit includes a cascaded chain of electronic inverters, each of which has a propagation delay time dependent upon the level of an applied control voltage, and a pulse shaping circuit which regenerates substantially the input pulse waveform. The time base corrector includes a frequency modulator which converts input signals to a square wave having a period dependent upon the input signal level, a voltage controlled, active, variable delay circuit which delays the square wave to correct time base instabilities, a demodulator which converts the delayed square wave to a signal substantially reproducing the input signal waveform with time corrections, an output, and an error detection circuit for applying to the control input of the variable delay circuit a signal indicative of the time error between a reference synchronization signal and the synchronization portion of the time corrected video signals. In a preferred form of time base corrector, an incremental delay circuit is used in conjunction with the variable delay circuit to provide a broader range of available correction.

11 Claims, 12 Drawing Figures

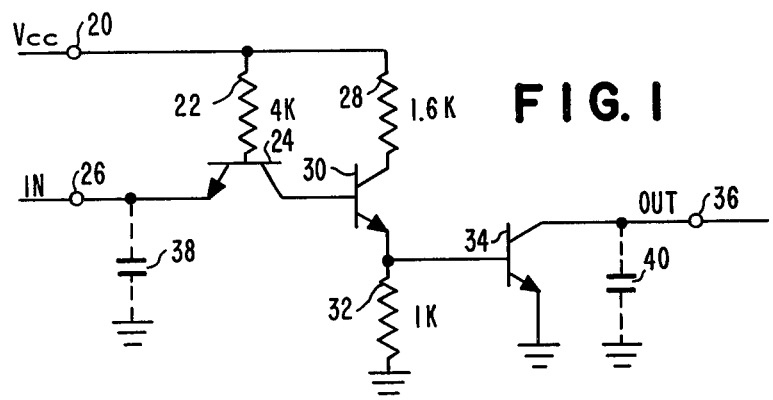
FIG. 1
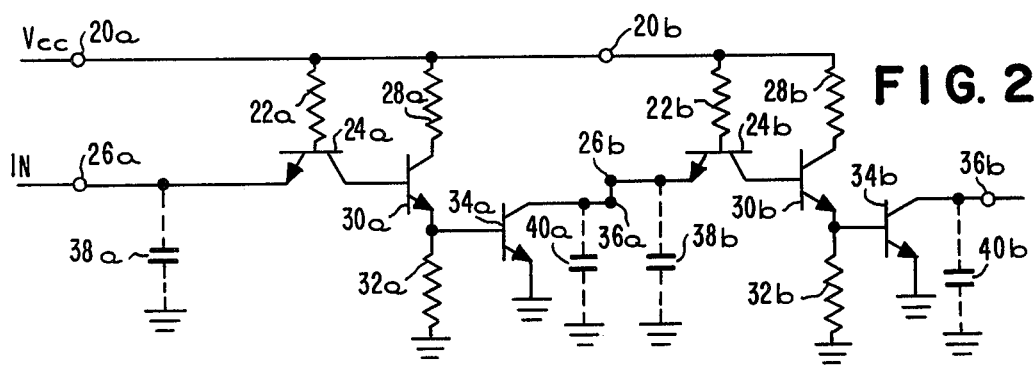
FIG. 2
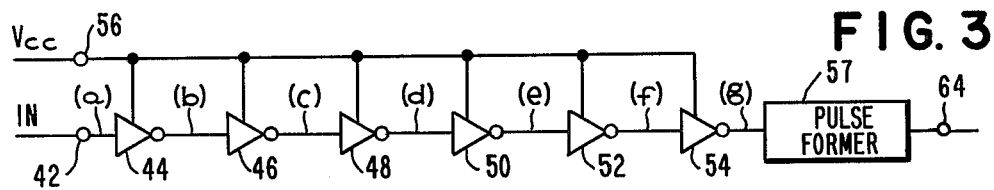
FIG. 3
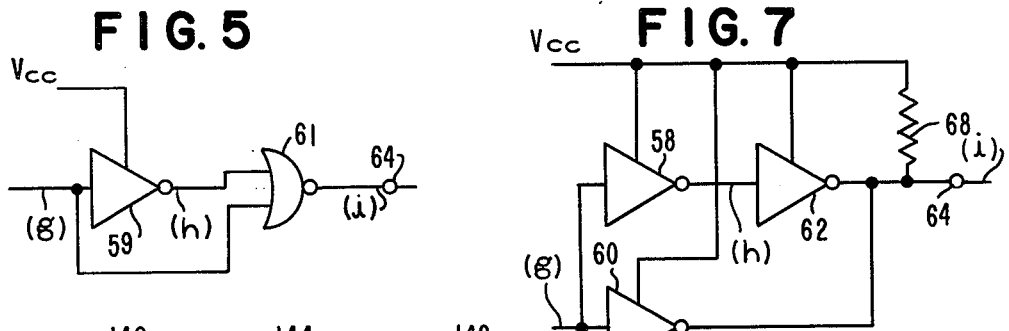
FIG. 5
FIG. 7
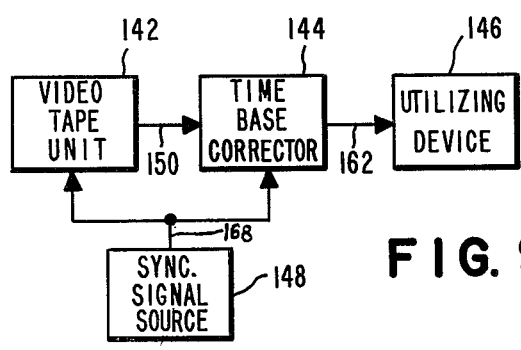
FIG. 9

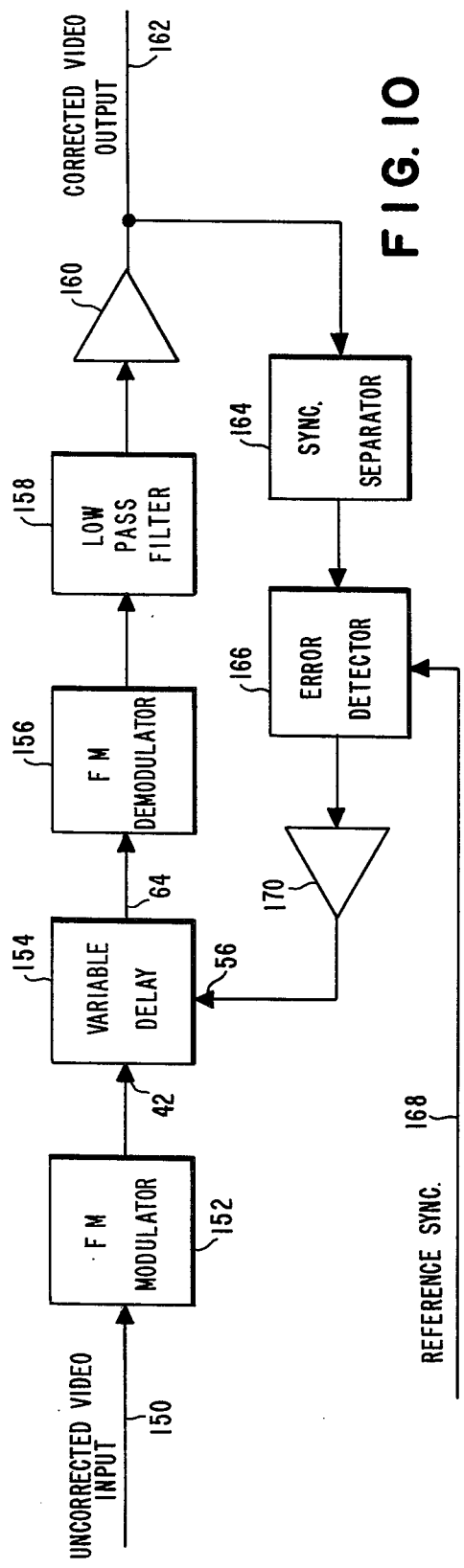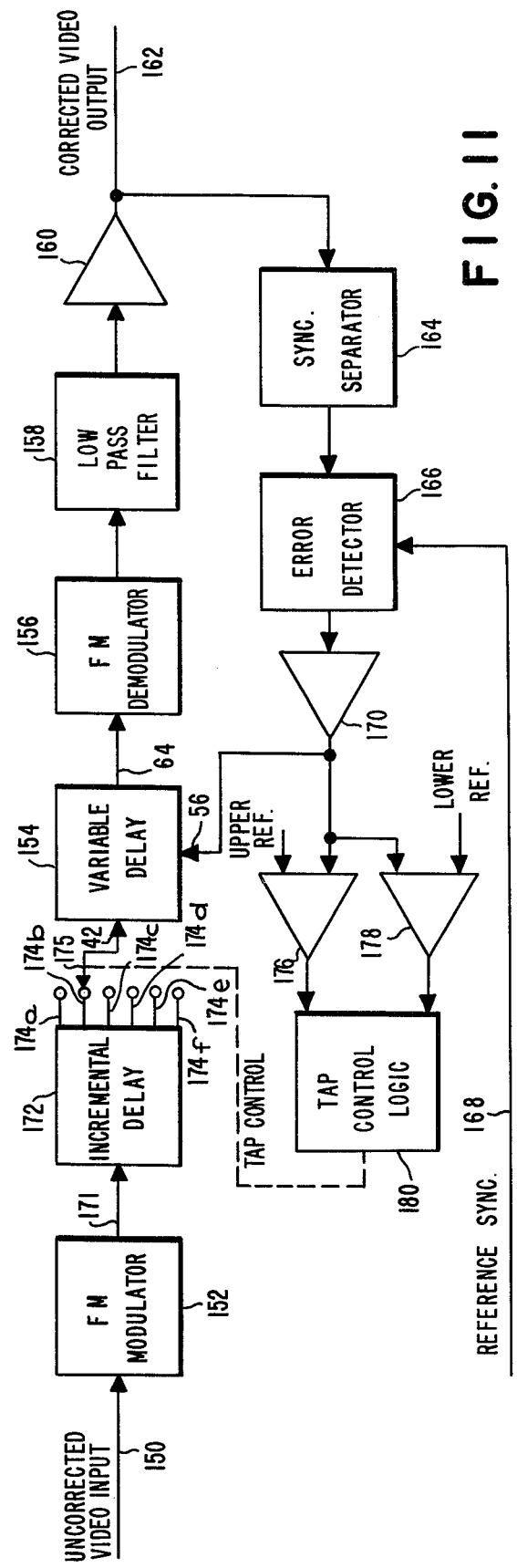

DELAY CIRCUIT

In one of its aspects the present invention is a variable time delay circuit for square wave or pulse signals, while in a second aspect the present invention is a video time base correction circuit for use in video recording system. More particularly, the present invention is a video time base correction circuit including a voltage controlled, active time delay circuit which provides variable delay of pulses.

Square wave or pulse signals, including frequency modulated or pulse width modulated signals such as video signals, radar signals and instrumentation signals that are bandwidth compressed or expanded or otherwise time base modified in any way, frequently must have delays introduced for purposes such as removing static or dynamic timing errors. In television programming timing errors frequently occur, for example during playback of a video tape, due to such things as tape slippage or stretching, variations in speed of the playback unit, etc. At present there are several ways of achieving delay or time base correction of wide bandwidth signals. Among these are such techniques as passing the signal through a delay line, for example a delay line composed of lumped inductors and capacitors or a coaxial cable, passing a carrier modulated signal through an acoustical delay line such as a quartz crystal or piano wire, and storing the signal in and then retrieving it from a digital memory which includes converting the signal to digital form for storage and reconverting it to analog form after retrieval. These existing techniques are undesirable in present day technology for several reasons, including high costs and high volume, weight, power consumption and heat dissipation. The complexity of some of these techniques, particularly, the technique involving analog to digital and then digital to analog conversion, lends itself to error and breakdown.

The present invention is a voltage controlled time delay circuit for square wave or pulse signals and a time base correction circuit for use with video recording devices. In accordance with the present invention a time delay circuit is provided utilizing a cascaded chain of inverters each having a variable propagation delay time, such as TTL digital integrated circuit open collector inverters without external pull up resistors, for example those available from Texas Instruments, Inc. under the designation SN 7405. The propagation delay time of such inverters is variable under control of a control voltage when no external pull up resistors are coupled to their outputs. As a consequence, an inexpensive, compact, simplified, low power variable time delay device is provided having extreme reliability, simplicity and component availability. This delay device is incorporated into a time base correction circuit for video signals. The video signals are applied to an FM modulator, the output of which is a symmetrical square wave at a frequency which is dependent upon the level of the input video signal. This square wave is then applied to a variable delay circuit in accordance with the present invention. The delayed square wave is passed to an FM demodulator which reconstructs the video signal with appropriate time correction.

These and other aspects and advantages of the present invention are more apparent in the following detailed description and claims, particularly when considered in conjunction with the accompanying drawings in which like parts bear like reference numerals. In the drawings:

FIG. 1 is a schematic diagram of an open collector, voltage controlled inverter circuit suitable for use in a delay device in accordance with the present invention;

FIG. 2 is a schematic diagram depicting two inverters of the type shown in FIG. 1 in cascade;

FIG. 3 is a block diagram of a typical delay circuit in accordance with the present invention;

FIG. 5 is a block diagram of one embodiment of pulse former circuit suitable for use with the delay circuit of FIG. 3;

FIG. 7 is a block diagram of a second embodiment of pulse former circuit suitable for use with the delay circuit of FIG. 3;

FIG. 9 is a block diagram of a video recording system incorporating a time base corrector in accordance with the present invention;

FIG. 10 is a block diagram of a first embodiment of time base corrector in accordance with the present invention;

FIG. 11 is a block diagram of a preferred embodiment of time base corrector in accordance with the present invention.

Figure 4:
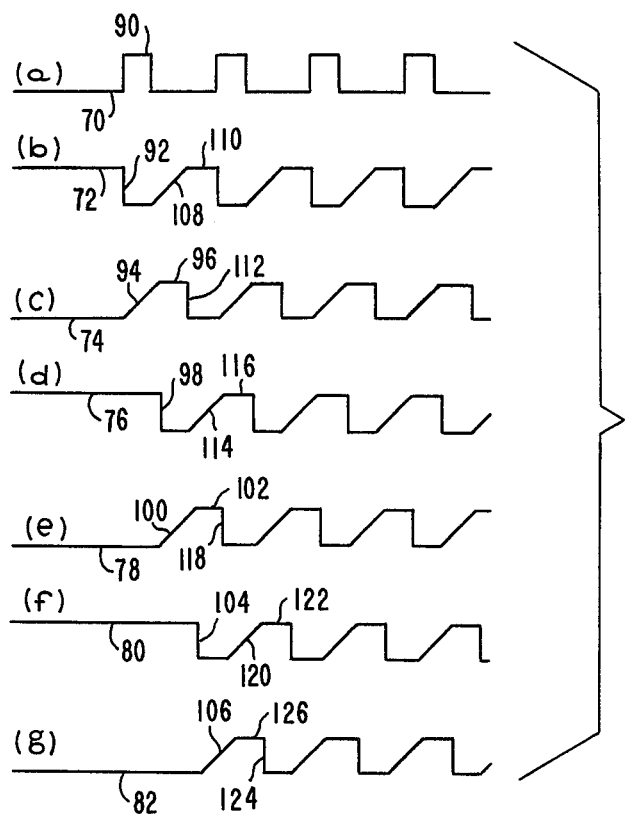
FIG. 4 is a diagram depicting wave forms found at various locations during operation of the circuit of FIG. 3.

FIG. 1 schematically depicts the circuitry of an open collector inverter having a propagation time dependent upon the level of a control voltage, such as an SN 7405 open collector inverter. Control input 20 is coupled through resistor 22 to the base of NPN transistor 24 which has its emitter tied to signal input 26. Control input 20 is also coupled through resistor 28 to the collector of NPN transistor 30, the base of which is tied to the collector of transistor 24. The emitter of transistor 30 is coupled to ground through resistor 32 and is tied to the base of NPN transistor 34. The emitter of transistor 34 is tied to ground, while the collector of transistor 34 is tied to output terminal 36. The inherent input capacitance of the circuit is depicted in FIG. 1 by a capacitor 38 which is coupled between input terminal 26 and ground. Similarly, the inherent output capacitance of the inverter circuit is depicted in FIG. 1 by capacitor 40 which is tied between output terminal 36 and ground.

A positive control voltage source Vcc is connected to control input 20, for example a voltage in the order of five volts d.c. With a low input applied to terminal 26, transistor 24 conducts. Consequently, transistors 30 and 34 are cut off, leaving output terminal 36 isolated from ground or open so that voltage can build up on capacitor 40. When the input at terminal 26 goes high, the emitter-base junction of transistor 24 cuts off and the collector-base junction conducts in reverse, causing transistors 30 and 34 to conduct. Therefore, output terminal 36 is coupled to ground through the collector-emitter circuit of transistor 34, and capacitor 40 is discharged to ground so that voltage cannot build up on capacitor 40.

FIG. 2 illustrates two inverters of the type illustrated in FIG. 1 connected in cascade. The components are designated in FIG. 2 with the same reference numerals as in FIG. 1, with the components designations of the first inverter of FIG. 2 including the suffix "a" and of the second inverter of FIG. 2 including the suffix "b". With the input of the first inverter of FIG. 2 low, transistor 34a is cut off, and so voltage from source Vcc is applied through resistor 22b and transistor 24b to build up voltage on capacitors 40a and 38b until transistor 24b conducts in reverse, turning on transistor 34b to bring output terminal 36b low. When the input signal applied to terminal 26a goes high, transistor 34a turns on, rapidly discharging capacitors 40a and 38b. This turns on transistor 24b, cutting off transistors 30b and 34b. The next low signal applied to input terminal 26a turns on transistor 24a, cutting off transistors 30a and 34a. This isolates output terminal 36a from ground, and voltage again builds up on capacitors 40a and 38b. The rate at which voltage builds up on capacitors 40a and 38b, and thus the length of time until transistor 24b conducts in reverse, is dependent upon the magnitudes of resistor 22b and capacitors 40a and 38b and the voltage level of source Vcc. Since the magnitudes of the resistor 22, capacitor 40 and capacitor 38 are fixed for the inverter circuit, this voltage build up time or rise time is dependent upon the control voltage Vcc magnitude.

FIG. 3 illustrates a number of voltage controlled open collector inverters cascaded to form a variable time delay circuit in accordance with the present invention. Input terminal 42 is tied to the input of open collector inverter 44 which has its output tied to the input of inverter 46. The output of inverter 46 is tied to the input of inverter 48 which, in turn, has its output tied to the input of inverter 50. The output of inverter 50 is tied to the input of inverter 52, the output of which is tied to the input of inverter 54. Each of inverters 44-54 has its control input tied to control terminal 56 to receive a control voltage Vcc. The output of inverter 54 is tied to the input of pulse former 57 which converts its input waveform to a pulse at the pulse former output terminal 64. Each inverter 44-54 is of the type depicted in FIG. 1.

When input terminal 42 is low, inverter 44 has its transistor 34 cut off. Voltage from source Vcc is applied through the control input of inverter 46 to build up on the capacitor 40 of inverter 44 and the input capacitor 38 of inverter 46. When that voltage reaches a sufficiently high level, the transistor 24 within inverter 46 conducts in reverse, causing transistors 30 and 34 within inverter 46 to conduct, and so the output of inverter 46 goes low. FIG. 4 depicts wave-forms illustrating this operation of the cascaded inverters. FIG. 4(a) depicts the input to terminal 42 as a series of pulses. Thus, in the quiescent or initial condition, the input to inverter 44 is low as depicted at point 70 in FIG. 4(a), while the output from inverter 44 is high, as depicted at point 72 in FIG. 4(b). At this time the inverter 46 output is low as indicated at point 74 in FIG. 4(c), while the inverter 48 output is high as shown at point 76 in FIG. 4(d). Likewise, the inverter 50 output is low as indicated at point 78 in FIG. 4(e), while the inverter 52 output is high, as shown at point 80 in FIG. 4(f). The inverter 54 output is thus low as shown at point 82 of FIG 4(g).

When the first pulse 90, shown in FIG. 4(a), is applied to the input of inverter 44, the output of that inverter rapidly drops low, as shown at point 92 of FIG. 4(b). Consequently, the inverter 46 output commences to rise as indicated by ramp 94 of FIG. 4(c). As set forth above, the rise time required for the inverter 46 output to reach the threshhold level of inverter 48 is dependent upon the magnitude of the control voltage Vcc. After this rise time has elapsed, the inverter 46 output has reached its positive level 96, and so the inverter 48 output falls as depicted at point 98 in FIG. 4(d). The low output from the inverter 48 causes the inverter 50 output to commence to rise, as shown at ramp 100 of FIG. 4(e). When the inverter 50 output has reached its positive level 102, the inverter 52 output goes negative, as depicted at point 104 of FIG. 4(f). At that time the inverter 54 output commences to rise as depicted at ramp 106 of FIG. 4(g). When pulse 90 ends, the output of inverter 44 commences to rise, as shown at ramp 108 in FIG. 4(b). When the inverter 44 output has reached its positive level 110, the output of inverter 46 falls, as depicted at point 112 of FIG. 4(c). Consequently, the inverter 48 output rises, as depicted at ramp 114 of FIG. 4(d) until it reaches its positive level 116 at which time the output of inverter 50 falls, as shown at point 118 of FIG. 4(e). This permits the output of inverter 52 to rise, as depicted by ramp 120 of FIG. 4(f). When the inverter 52 output reaches its positive level 122, the inverter 54 output falls, as depicted at point 124 of FIG. 4(g). Each input pulse applied to signal input 42 causes a similar sequence of operation in the inverter stages 44-54, as illustrated by the waveforms of FIGS. 4(b)-4(g).

Figure 6:
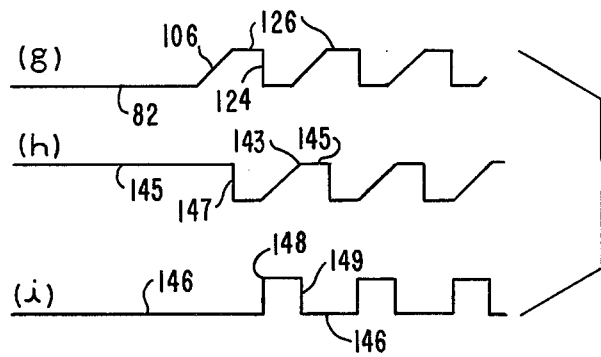
FIG. 6 depicts wave forms found in the circuit of FIG. 5.

The waveform of FIG. 4(g) is applied by inverter 54 to pulse former 57 which converts it to a pulse waveform. FIG. 5 depicts one embodiment of pulse former suitable for use as pulse former 57. The FIG. 4(g) waveform is applied to the input of inverter 59 which has its control input connected to a control voltage source Vcc. The FIG. 4(g) waveform is also applied to one input of NOR gate 61, the second input of which is connected to the output of inverter 59. The output of NOR gate 61 is tied to the pulse former output terminal 64. FIG. 6 depicts waveforms in this pulse former. For convenience the pulse former input waveform of FIG. 4(g) is repeated at FIG. 6(g). Initially, when the output of inverter 54, and thus the input to inverter 59, is at a low level, as depicted at point 82 in FIG. 6(g), the output of inverter 59 is at a high level, as depicted at level 145 in FIG. 6(h), and so the output of NOR gate 61 is at a low level, as depicted at level 146 in FIG. 6(i). The input to inverter 59 rises, as shown by voltage ramp 106 of FIG. 6(g), and when it reaches level 126, the output of inverter 59 falls, as shown at point 147 in FIG. 6(h). Because the FIG. 6(g) waveform is now high, the output of NOR gate 61 remains low. When this FIG. 6(g) waveform falls as shown at point 124, the output of NOR gate 61 rises as shown at point 148 of FIG. 6(i). At this same time the output of inverter 59 commences to rise. The rise time of inverter 59 is determined by the value of THE Vcc OF NOR GATE 61 and by the current reaching its capacitor 40 through NOR gate 61. When the inverter 59 output reaches the threshhold level of NOR gate 61, depicted at point 143 in FIG. 6(h), the output from NOR gate 61 returns to level 146, as shown at point 149 in FIG. 6(i). This sequence is repeated with each pulse of the FIG. 6(g) waveform, as seen in FIG. 6. The NOR gate 61 output of FIG. 6(i) is the pulse former output and is available at the pulse former output terminal 64. As seen in FIG. 6, this output substantially reproduces the input pulse waveform of FIG. 4(a) with a delay determined by the number of inverter stages in the delay circuit, the rise time of each inverter, and the input pulse width. If D is the delay time, N the number of inverter stages, T the pulse propagation or rise time, and P the width of input pulse 90, then $D = N/2\ T + P$, where $N$ is an even integer. The rise time $T$ is dependent upon the magnitude of the control voltage Vcc, and so the circuit is a voltage controlled active delay. Analysis of FIGS. 3–6 shows that the portion of the delay time introduced by the cascaded inverters 44–54 is $N/2\ T$ while the remaining portion P is introduced by the pulse former of FIG. 5.

FIG. 7 depicts an alternative embodiment of pulse former suitable for use as pulse former 57. The FIG. 4(g) waveform is applied to the input of inverter 58 and to the input of inverter 60. The output of inverter 58 is connected to the input of inverter 62. Inverter 60 is connected to shunt cascaded inverters 58 and 62 and so has its output tied to the output of inverter 62. The junction of the outputs of inverters 60 and 62 is tied to the pulse former output terminal 64. Inverters 58, 60 and 62 each have their control input tied to a positive control voltage sources Vcc. The junction of the output of inverter 60 and the output of inverter 62 is coupled by resistor 68 to positive voltages source Vcc. Resistor 68 is of a relatively low value, in the order of about 470 ohms.

Figure 8:
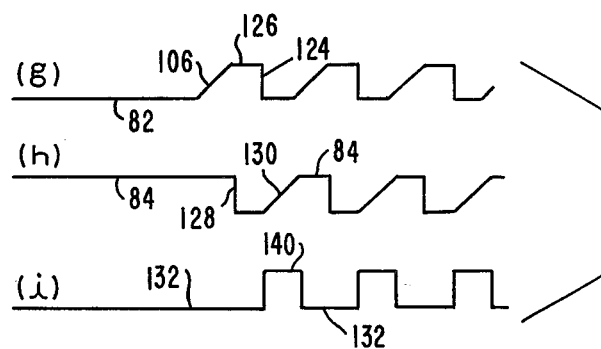
FIG. 8 depicts wave forms in the circuit of FIG. 7.

Operation of the pulse former of FIG. 7 is depicted in FIG. 8. The FIG. 4(g) output waveform from inverter 54, which is applied as the input to inverters 58 and 60, is repeated for convenience in FIG. 8(g). So long as this is at the low level 82, the output from inverter 58 is high, as depicted at point 84 in FIG. 8(h). When the input to inverter 54 goes low, its output rises, as depicted by ramp 106 of FIG. 8(g). When that output reaches level 126, the output of inverter 58 drops to its low level, as shown at point 128 in FIG. 8(h). When the input to inverter 58 goes low at point 124 of FIG. 8(g), the output of inverter 58 commences to rise until it reaches its high level 84. The inverter 58 output has substantially the same rise time as do the outputs from inverters 44–54, as shown by ramp 130 of FIG. 8(h). This sequence is repeated for each pulse of waveform 8(g).

When the input applied to inverters 58 and 60 is low at level 82 of FIG. 8(g), the transistor 34 in inverter 60 is cut off. The high output from inverter 58, depicted at level 84 of FIG. 8(h) results in the transistor 34 of inverter 62 conducting. Consequently, output terminal 64 is coupled to ground, and so the pulse former output is low, as depicted at level 132 of FIG. 8(i). When the input signal reaches level 126 of FIG. 8(g), transistor 34 of inverter 60 conducts, and so output terminal 64 is then coupled to ground through that path. Thus, the pulse former output remains at low level 132 of FIG. 8(i), even though the transistor 34 of inverter 62 cuts off. When the input to inverters 58 and 60 then goes low at point 124 in FIG. 8(g), the transistor 34 of inverter 60 cuts off. Current through pull up resistor 68 causes a rapid voltage rise at output terminal 64, as depicted by pulse 140 of FIG. 8(i). This pulse remains until the input to inverter 62, depicted as ramp 130 of FIG. 8(h), reaches the threshhold 84 of inverter 62, at which point the transistor 34 of inverter 62 conducts, bringing terminal 64 back to its low level 132 and terminating the output pulse. This cycle repeats for each pulse of the FIG. 8(g) waveform applied to inverters 58 and 60.

A comparison of the FIG. 6 waveforms and the FIG. 8 waveforms shows that the pulse formers of FIG. 5 and FIG. 7 have substantially identical operation. Likewise, comparison of the output waveform of FIG. 8(i) with the variable delay circuit input waveform of FIG. 4(a) shows that the time delay is equal to $D = N/2\ T + P$, where D is the delay time, N is the number of inverter stages in the delay circuit of FIG. 3 ($N$ is an even integer), T is the rise time of those inverter stages, and P is the pulse width of input pulse 90. Once more the cascaded inverters 44–54 introduce the delay $N/2\ T$ while the pulse former of FIG. 7 introduces the delay P. Thus, again a voltage controlled variable active delay circuit is provided.

FIG. 9 depicts a video signal system utilizing a time base corrector having a variable time delay circuit in accordance with the present invention. Video tape unit 142 plays back previously recorded video tapes and applies the video signal via line 150 to time base corrector 144. Corrected video signals are applied from time base corrector 144 via line 162 to utilizing device 146 which might be a television transmitter, a picture monitor, a video signal switcher, or other device. Synchronization signal source 148 has its output applied by line 168 to video tape unit 142 and to time base corrector 144 to provide synchronization signals at the necessary video signal rate. If the output from video tape unit 142 remained synchronized with the synchronization signals from source 148, no time base correction would be necessary. However, time base instabilities are introduced by such things as variations in head-to-tape speed, variations in tape tension, tape stretch, and mechanical vibrations in the scanning assembly. If uncorrected, these instabilities would result in picture jitter and other degradations of the video signal received by utilizing device 146.

FIG. 10 depicts in block diagram form a video time base corrector suitable for use as time base corrector 144 and having a variable active delay in accordance with the present invention. The uncorrected video input signal is applied by line 150 to FM modulator 152 which converts the input analog signal to a square wave signal in which the frequency or the period of the square wave varies in accordance with the input analog voltage level. By way of example, a video input signal on line 150 having a one volt peak-to-peak range may produce an output square wave pulse train from modulator 152 with frequency ranging from 5.5 megahertz to 6.6 megahertz. FM modulator 152 might be a voltage controlled free-running multivibrator, for example. This square wave output from FM modulator 152 is applied to variable delay device 154 which can be constructed in accordance with the delay circuit of FIG. 3 with the FM modulator 152 output applied to signal input terminal 42. The output signal from output terminal 64 of variable delay 154 is applied to FM demodulator 156 which can be a conventional FM demodulator and which converts the FM square wave signal to an analog signal reproducing the original input signal with appropriate time correction. The demodulator output is passed through low pass filter 158 and video amplifier 160 to output line 162. Low pass filter 158 passes only the video frequencies, for example frequencies up to about 4.5 megahertz, while rejecting the FM carrier frequencies. The output of video amplifier 160 is the time corrected video output signal and is a reproduction of the original input signal level.

The amplifier 160 output is also applied to sync separator 164 which clips the video signals and passes only the synchronization signals that are transmitted as a part of the composite video signal. These synchronization signals are applied to error detector 166. Error detector 166 receives the reference synchronization signal on line 168 from sync signal source 148 and produces an error signal indicative of the relative difference in timing between its two received signals. By way of illustration, error detector 166 can be a voltage ramp generator turned on by the first signal applied to it, turned off by the second signal applied to it, having the polarity determined by the signal first received, and having the ramp output summed with a reference signal indicative of zero time error. This error signal from error detector 166 is applied through amplifier 170 to the control signal input 56 of variable delay circuit 154. Thus, as the error signal varies, the delay introduced by variable delay circuit 154 varies.

Variable delay circuit 154 includes sufficient inverter stages to provide a range of time correction of the desired amount. By way of example, variable delay circuit 154 might be capable of providing a maximum delay in the order of three microseconds and a minimum delay in the order of two microseconds, thus giving a range of correction of the difference between these times, or one microsecond; i.e., plus or minus one-half microsecond. Thus, in the system of FIG. 10, a delay of 2½ microseconds is introduced to all video signals, and a time correction in the range of from plus ½ microsecond to minus ½ microsecond is provided by variable delay 154, with the amount of time correction determined by the voltage output from error detector 166.

FIG. 11 depicts in logical block diagram form a preferred embodiment of time base corrector using the variable delay circuit in conjunction with an incremental delay circuit to permit an expanded range of delays. Again, the uncorrected video input signal is applied by line 150 to FM modulator 152. The output of modulator 152 is applied by line 171 to the input of incremental or tapped delay circuit 172 which is capable of providing any of a plurality delays and is depicted in FIG. 11 as having a plurality of output terminals, for example six output terminals, 174a, 174b, 174c, 174d, 174e and 174f. In the illustrative embodiment shown in FIG. 11, each of the output terminals 174 is connected to a fixed contact of a switch 175, the moving contact of which is tied to signal input terminal 42 of variable delay circuit 154. The output terminal 64 of variable delay circuit 154 is coupled through FM demodulator 156, low pass filter 158 and amplifier 160 to output line 162, just as in the embodiment of FIG. 10. Likewise, the output of amplifier 160 is applied to sync separator 164 which passes synchronization signals to error detector 166. Reference synchronization signals are applied by line 168 to error detector 166, and an error signal indicative of the time difference between these synchronization signals is applied through amplifier 170 to control input 56 of variable delay circuit 154. The error signal from amplifier 170 is also applied to one input of upper limit comparison amplifier 176 and to one input of lower limit comparison amplifier 178. Upper limit comparison amplifier 176 receives at its second input a voltage reference signal indicative of the upper limit of error which can be compensated by variable delay circuit 154, a signal indicative of a plus one-half microsecond error in the above typical example. Similarly, lower limit comparison amplifier 178 receives at its second input a reference signal indicative of the lower limit of error which can be compensated by variable delay circuit 154, in the above typical example a signal indicative of a minus one-half microsecond error.

Upper limit comparison amplifier 176 compares the error signal applied to it by amplifier 170 against the reference voltage representing the upper limit of error compensation which can be made by variable delay circuit 154. If this limit is reached, upper limit comparison amplifier 176 produces a signal which causes tap control logic circuit 180 to step the position of switch 175 one step to add one microsecond of delay to the signal path. Error detector 166 then detects a change in the time error and changes the error voltage applied to variable delay 154 to change the delay introduced by that circuit. Similarly, if the error signal from amplifier 170 reaches the lower limit reference voltage of lower limit comparison amplifier 178, circuit 178 generates a signal which causes tap control logic 180 to step the position of switch 175 to remove one microsecond of delay from the signal path, and error detector 166 then detects this change in the time error and changes the error voltage from amplifier 170 to change the delay introduced by variable delay circuit 154.

Figure 12:
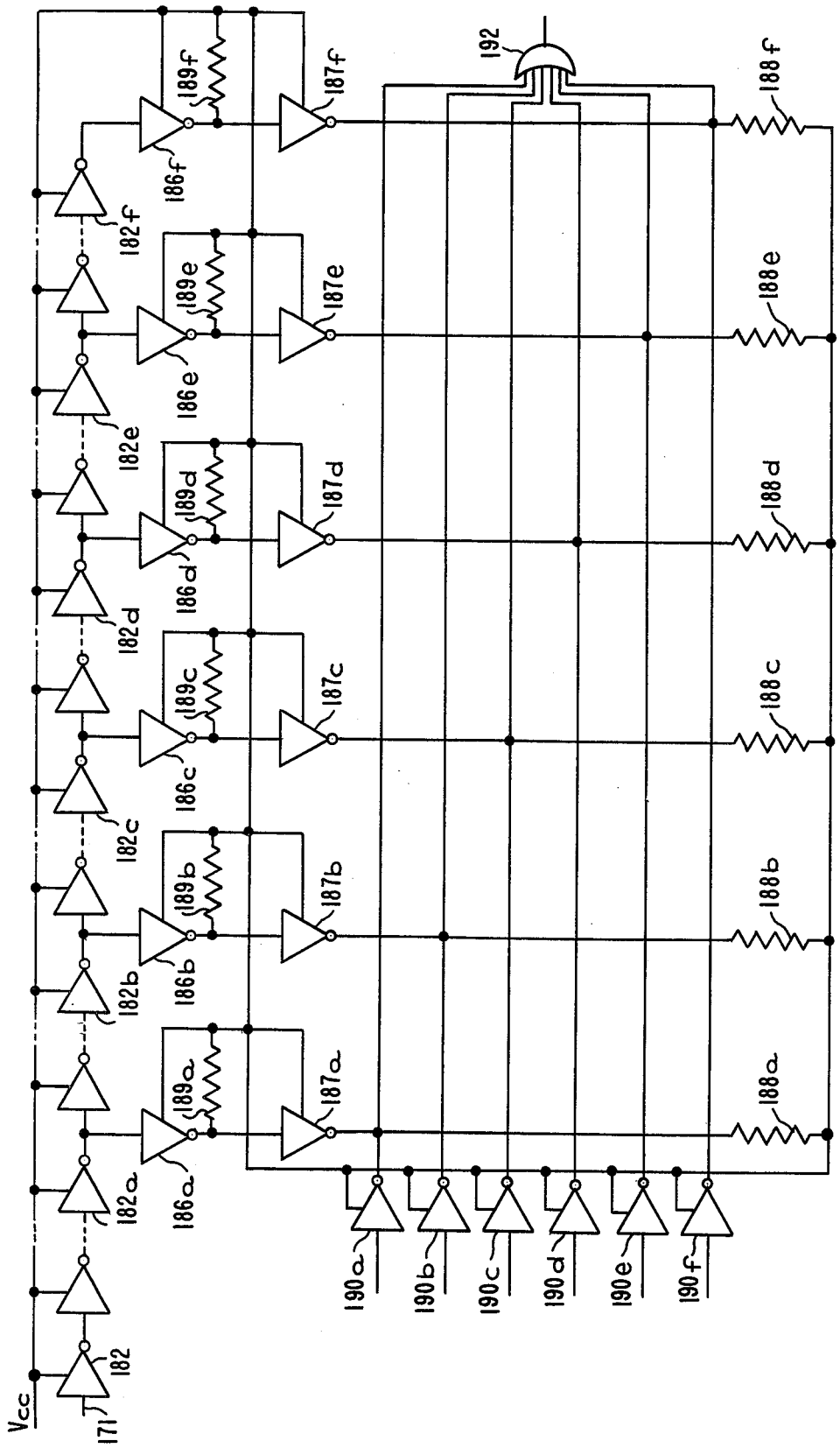
FIG. 12 is a block diagram of a tapped delay circuit suitable for incorporation into the time base corrector of FIG. 11.

Preferably, switch 175 is a solid state device. FIG. 11 depicts the logic of this time base corrector. FIG. 12 depicts solid state circuitry which can be utilized as incremental tapped delay circuit 172 and switch 175. The output from FM modulator 152 is applied by line 171 through a cascaded chain of inverters which can be inverters of the type depicted in FIG. 1 with their control inputs each tied to control voltage source Vcc. There are sufficient inverters to provide the maximum amount of time delay desired, e.g., sufficient inverters to provide six microseconds delay. The outputs of those inverters associated with the amount of delay in the delay range of variable delay 154, e.g., one-microsecond, are each connected to the input of another inverter. Thus, as shown in FIG. 12, between the input to the first inverter 182 and the output inverter 182a, one microsecond of delay is introduced. The output of inverter 182a is connected to the input of inverter 186a. Between the output of inverter 182a and the output of inverter 182b, another one microsecond of delay is introduced, and the output of inverter 182b is tied to the input to inverter 186b. Likewise, one microsecond of delay is introduced between inverters 182b and 182c, between inverters 182c and 182d, and between inverters 182d and 182e, and between inverters 182e and 182f, and inverters 182c, 182d, 182e, and 182f have their outputs tied to the inputs of inverters 186c, 186d, 186e, and 186f, respectively. There must be an even number of inverters 182 between each inverter 186. Each of the inverters 186 has its control input tied to the control voltage source Vcc.

Each of the inverters 186a–186f has its output coupled through a uniquely associated inverter 187a–187f and relatively low resistor 188a–188f to the control voltge source Vcc. Each resistor 188a–188f has a resistance in the order of 470 ohms. Each inverter 186a–186f has its output coupled through an associated resistor 189a–189f of a relatively low valve, e.g., in the order of 470 ohms, to the control voltage source Vcc. Inverters 190a–190f have their outputs tied to the output of inverters 187a–187f, respectively. Inverters 186a–186f, 187a–187f, and 190a–190f have their control inputs tied to control voltage source Vcc. The inputs to inverters 190a–190f receive signals from tap control logic 180 indicative of the amount of delay to be introduced by tapped delay circuit 172. In such case, tap control logic 180 might be an electronic stepping swich which is stepped in one direction by signals from upper limit comparison amplifier 176 and in the other direction by signals from lower limit comparison amplifier 178. The junctions of the outputs of inverters 187a–187f and the outputs of inverters 190a–190f are connected as inputs to OR gate 192, the output of which is the tapped delay carcuit output signal that is applied to signal input 42 of variable delay circuit 154.

The square wave from FM modulator 152 is applied by line 171 to the cascaded inverter chain. Tap control logic 180 applies a low signal to the one of the inverters 190a–190f associated with the amount of delay to be introduced by tapped delay 172 and applies high signals to the remaining inverters 190a–190f. Thus, assume tap control logic 180 applies a low signal to inverter 190a and high signals to inverters 190b–190f. The transistors 34 in the inverters 190b–190f conduct, coupling the junctions of the outputs of inverters 190b–190f and the outputs of inverters 187b–187f to ground. However, the transistor 34 in inverter 190a is cut off. Initially the output of each inverter 182a, 182b, 182c, 182d, 182e and 182f is low, and so the outputs of inverters 187a–187f are low. The square wave is applied via line 171 to the inverter chain, and when the first high pulse is received from the output of inverter 182a, the output of inverter 186a goes low. Consequently, the output of inverter 187a goes high. The relatively low value of resistor 188a results in a rapid rise in the output voltage from inverter 187a. This high pulse passes through OR gate 192 to variable delay circuit 154. As the delayed input pulse is propagated by inverters 182b–182f, the transistors 34 in the outputs of inverters 187b–187f cut off in sequence. However, because the transistors 34 in inverters 190b–190f are conducting, the voltage pulse cannot be reproduced at the outputs of inverters 187b–187f. Consequently, the tapped delay circuit passes an output pulse only after the delay time associated with the one of the inverters 190a–190f which is receiving a low signal from tap control logic 180. The relatively high current through resistor 189a causes the output voltage level of inverter 186a to rise rapidly once the pulse has decayed at its input.

The time base correction circuit of either FIG. 10 or FIG. 11 could be incorporated into a video tape unit in a manner utilizing the FM signal within that unit so that the FM signal is applied either to variable delay 154 of FIG. 10 or to tapped delay 172 of FIG. 11, in which case FM modulator 152 is omitted. Likewise, while a suitable incremental delay circuit is illustrated in FIG. 12, other suitable circuits could be utilized. Design optimization may permit elimination of some of the inverters depicted. The time delay circuit of FIG. 3 must, of course, have sufficient inverters to provide the desired delay. As a practical matter, each inverter stage has a rise time in the order of about 25 nanoseconds, and so to achieve a one microsecond delay, a cascaded chain of about 80 inverters is required. Thus, it can be seen that while the present invention has been described with respect to representative examples and preferred embodiments, numerous alterations and rearrangements could be made, and still the result would be within the scope of the invention.

What is claimed is:

1. A voltage controlled, active, variable delay circuit for voltage pulse waveforms comprising:
    control voltage source means;
    a cascaded chain of N electronic inverters, with N being an even integer, each inverter having a control input connected to the control voltage source means and a signal input for receiving voltage pulses to be delayed, each electronic inverter having a pulse propagation delay time T which is a function of the level of the control voltage applied by the control voltage source means to the control input, to give a delay interval D = 2/N T between application of an input voltage pulse to the signal input of the first electronic inverter of the cascaded chain and generation of an output voltage pulse by the last electronic inverter of the cascaded chain which is dependent upon the level of the control voltage; and
    a pulse shaping circuit connected to the last electronic inverter of the cascaded chain to shape the output voltage pulse received therefrom to substantially reproduce the input voltage pulse waveform.

2. A variable delay circuit as claimed in claim 1 in which the electronic inverters are open collector inverters.

3. A video signal time base corrector comprising:
    input means for receiving an uncorrected video signal including a video message portion and a synchronization portion;
    frequency modulation means connected to said input means for converting the uncorrected video input signal to a square wave pulse train having an instantaneous period dependent upon the instantaneous voltage level of the uncorrected video input signal;
    a voltage controlled active variable delay circuit having a signal input terminal and a control input terminal, said voltage controlled active variable delay circuit delaying the square wave pulse train applied thereto by a time interval dependent upon the instantaneous level of voltage at said control input terminal;
    first coupling means coupling said frequency modulation means to said voltage controlled active variable delay circuit signal input terminal for applying the square wave pulse train thereto;
    frequency demodulator means connected to said voltage controlled active variable delay circuit for converting the delayed square wave to a time corrected video signal substantially reproducing the wave form of the uncorrected video signal;
    output means coupled to the frequency demodulator means for applying the time corrected video signal to a utilizing device;
    synchronization error detection means, having a first input to receive a reference synchronization signal and a second input coupled to the demodulator means for generating an error signal having a voltage level indicative of the time difference between the reference synchronization signal and the time corrected video signal synchronization portion; and
    second coupling means coupling the synchronization error detector means to the voltage controlled active variable delay circuit control input means for application thereto of the error signal.

4. A time base corrector as claimed in claim 3 in which said voltage controlled active variable delay circuit comprises:
    a cascaded chain of electronic inverters, each having a control input connected to said control input terminal and a signal input for receiving voltage pulses to be delayed, the signal input of the first electronic inverter of said cascaded chain of electronic inverters connected to said signal input terminal to receive a square wave pulse train therefrom, each electronic inverter having a propagation delay time to give a delay interval between application of an input voltage pulse to the signal input of said first electronic inverter of said cascaded chain and generation of an output voltage pulse by the last electronic inverter of said cascaded chain, with the pulse propagation delay time of the electronic inverters a function of the control voltage applied to the control inputs of the electronic inverters in the cascaded chain; and a pulse shaping circuit connected to the last electronic inverter of the cascaded chain to shape the output voltage pulse received therefrom to substantially reproduce the square wave pulse train waveform.

5. A time base corrector as claimed in claim 3 in which said first coupling means comprises:

comparison means connected to said synchronization error detection means for generating a comparison signal indicative of a time difference between the reference synchronization signal and the time corrected video signal synchronization portion which time difference is greater than can be corrected by the voltage controlled active variable delay device;

incremental delay means for delaying the square wave pulse train by any one of a plurality of incremental amounts; and control means responsive to comparison signals for activating said incremental delay means to delay the square wave pulse train by a time increment of which the comparison signal is indicative.

6. A time base corrector as claimed in claim 5 in which said incremental delay means includes a cascaded chain of electronic inverters.

7. A voltage controlled, active, variable delay circuit for voltage pulse waveforms comprising:

voltage source means;

a cascaded chain of N electronic inverters, with N being an even integer, each inverter having a control input connected to the control voltage source means and a signal input for receiving voltage pulses to be delayed, each electronic inverter having a pulse propagation delay time T which is a function of the level of the control voltage applied by the control voltage source means to the control input, to give a delay interval $D = 2/N\ T$ between application of an input voltage pulse to the signal input of the first electronic inverter of the cascaded chain and generation of an output voltage pulse by the last electronic inverter of the cascaded chain which is dependent upon the level of the control voltage; and a pulse shaping circuit connected to the last electronic inverter of the cascaded chain to shape the output voltage pulse received therefrom.

8. A voltage controlled, active, variable delay circuit for voltage pulse waveforms comprising:

control voltage source means; and a cascaded chain of N electronic inverters, with N being an even integer, each inverter having a control input connected to the control voltage source means and a signal input for receiving voltage pulses to be delayed, each electronic inverter having a pulse propagation delay time T which is a function of the level of the control input, to give a delay interval $D = 2/N\ T$ between application of an input voltage pulse to the signal input of the first electronic inverter of the cascaded chain and generation of an output voltage pulse by the last electronic inverter of the cascaded chain which is dependent upon the level of the control voltage.

9. A voltage controlled, active, variable delay circuit for voltage pulse waveforms comprising:

control voltage source means;

a cascaded chain of electronic inverters, each having a control input connected to the control voltage source means and a signal input for receiving voltage pulses to be delayed, each electronic inverter having a pulse propagation delay time which is a function of the level of the control voltage applied by the control voltage source means to the control input, to give a delay interval between application of an input voltage pulse to the signal input of the first electronic inverter of the cascaded chain and generation of an output voltage pulse by the last electronic inverter of the cascaded chain which is dependent upon the level of the control voltage; and a pulse shaping circuit including an electronic inverter having a control input for connection to a source of control voltage, a signal input connected to the last electronic inverter of the cascaded chain for receiving and shaping the output voltage pulses therefrom, and an output; and gating means having a first input connected to the last electronic inverter of the cascaded chain for receiving the voltage pulses to be shaped and a second input connected to said pulse shaping circuit electronic inverter output, said gating means providing an output pulse in the absence of an input pulse at each of the two gating means inputs to substantially reproduce the input voltage pulse waveform.

10. A voltage controlled, active, variable delay circuit for voltage pulse waveforms comprising:

control voltage source means;

a cascaded chain of electronic inverters, each having a control input connected to the control voltage source means and a signal input for receiving voltage pulses to be delayed, each electronic inverter having a pulse propagation delay time which is a function of the level of the control voltage applied by the control voltage source means to the control input, to give a delay interval between application of an input voltage pulse to the signal input of the first electronic inverter of the cascaded chain and generation of an output voltage pulse by the last electronic inverter of the cascaded chain which is dependent upon the level of the control voltage; and a pulse shaping circuit for shaping the output voltage pulse received therefrom to substantially reproduce the input voltage pulse waveform, said pulse shaping circuit comprising a cascaded pair of electronic inverters, each having a control input for connection to a source of voltage, a signal input, and an output, the signal input of the first of said cascaded pair of electronic inverters connected to the last electronic inverter of the cascaded chain for receiving voltage pulses to be shaped; a further electronic inverter having a signal input and an output and connected to shunt said cascaded pair of electronic inverters and having a control input for connection to a source of voltage; and a pull-up resistor for coupling the junction of the output of said further electronic inverter and the output of the second of the cascaded pair of electronic inverters to a voltage source.

11. A voltage controlled, active, variable delay circuit for voltage pulse waveforms comprising:
control voltage source means;
a cascaded chain of open collector electronic inverters, each having a control input connected to the control voltage source means and a signal input for receiving voltage pulses to be delayed, each electronic inverter having a pulse propagaton delay time which is a function of the level of the control voltage applied by the control voltage source means to the control input, to give a delay interval between application of an input voltage pulse to the signal input of the first electronic inverter of the cascaded chain and generation of an output voltage pulse by the last electronic inverter of the cascaded chain which is dependent upon the level of the control voltage; and
a pulse shaping circuit connected to the last electronic inverter of the cascaded chain to shape the output voltage pulse received therefrom.

* * * * *